United States Patent
Qu et al.

(10) Patent No.: US 8,497,563 B2
(45) Date of Patent: Jul. 30, 2013

(54) SEMICONDUCTOR DEVICE AND METHOD FOR ITS MANUFACTURE

(75) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 169 days.

(21) Appl. No.: 12/733,753

(22) PCT Filed: Sep. 15, 2008

(86) PCT No.: PCT/EP2008/062251
§ 371 (c)(1),
(2), (4) Date: Jun. 7, 2010

(87) PCT Pub. No.: WO2009/040265
PCT Pub. Date: Apr. 2, 2009

(65) Prior Publication Data
US 2010/0237456 A1    Sep. 23, 2010

(30) Foreign Application Priority Data
Sep. 21, 2007  (DE) .......................... 10 2007 045 185

(51) Int. Cl.
*H01L 29/66* (2006.01)
(52) U.S. Cl.
USPC .... 257/481; 257/471; 257/476; 257/E21.359; 257/E29.338
(58) Field of Classification Search
USPC .......... 257/481, E29.335, 471, 476, E21.359, 257/E29.338
See application file for complete search history.

(56) References Cited

U.S. PATENT DOCUMENTS

| | | | |
|---|---|---|---|
| 5,216,275 | A | 6/1993 | Chen |
| 2005/0029222 | A1 | 2/2005 | Chen |
| 2008/0128850 | A1 | 6/2008 | Goerlach et al. |

FOREIGN PATENT DOCUMENTS

| | | |
|---|---|---|
| DE | 694 28 996 | 6/2002 |
| DE | 10 2004 053 760 | 5/2006 |
| EP | 0 707 744 | 4/1996 |
| JP | 8-512430 | 12/1996 |
| JP | 2000-216409 | 8/2000 |
| JP | 2001-284604 | 10/2001 |
| JP | 2007-42997 | 2/2007 |
| JP | 2008-519448 | 6/2008 |
| JP | 2008-258313 | 10/2008 |
| WO | WO 2006/048354 | 5/2006 |
| WO | WO 2006/061277 | 6/2006 |

OTHER PUBLICATIONS

Rajesh N Gupta et al.: "A Novel Planarized, Silicon Trench Sidewall Oxide-Merged p-i-n Schottky (TSOX-MPS) Rectifier" IEEE Electron Device Letters, IEEE Service Center, New York, NY, US, vol. 20, No. 12, Dec. 1, 1999.

*Primary Examiner* — Julio J Maldonado
*Assistant Examiner* — Amar Movva
(74) *Attorney, Agent, or Firm* — Kenyon & Kenyon LLP

(57) ABSTRACT

A semiconductor system having a trench MOS barrier Schottky diode, having an integrated substrate PN diode as a clamping element (TMBS-ub-PN), suitable in particular as a Zener diode having a breakdown voltage of approximately 20V for use in a vehicle generator system, the TMBS-sub-PN being made up of a combination of Schottky diode, MOS structure, and substrate PN diode, and the breakdown voltage of substrate PN diode BV_pn being lower than the breakdown voltage of Schottky diode BV_schottky and the breakdown voltage of MOS structure BV_mos.

15 Claims, 2 Drawing Sheets

SEMICONDUCTOR DEVICE AND METHOD FOR ITS MANUFACTURE

BACKGROUND OF THE INVENTION

1. Field of the Invention

The present invention relates to a Trench MOS Barrier Schottky Diode having an integrated Substrate-PN diode as a clamping element, hereinafter referred to as a TMBS-sub-PN, suitable for use as a Zener power diode having a breakdown voltage of approximately 20 V for use in vehicle generator systems.

2. Description of Related Art

In modern motor vehicles, functions are increasingly realized using electronic components. This creates a growing need for electrical power. In order to meet this need, the efficiency of the vehicle generator system has to be increased. Standardly, as a rule PN diodes are used as Zener diodes in the vehicle generator system. Advantages of the PN diodes are on the one hand their low blocking voltage and on the other hand high robustness. The main disadvantage is the high forward voltage UF. At room temperature, current does not begin to flow until UF=0.7V. Under normal operating conditions, e.g. a current density of 500 A/cm$^2$, UF increases to greater than 1V, resulting in a non-negligible loss of efficiency.

Theoretically, a Schottky diode could be used as an alternative. Schottky diodes have a significantly lower forward voltage than do PN diodes, e.g. 0.5V to 0.6V at a high current density of 500 A/cm$^2$. Moreover, Schottky diodes, as majority carrier components, have advantages during rapid switching operation. However, up to now Schottky diodes have not been used in vehicle generator systems. This is due to some decisive disadvantages of Schottky diodes: 1) higher blocking current in comparison with PN diodes, 2) stronger dependence of the blocking current on the blocking voltage, and 3) poor robustness, in particular during high-temperature operation.

Proposals have been made for improving Schottky diodes. One of these is the TMBS (Trench MOS Barrier Schottky diode), described for example in EP 0707 744 B1 or in published German patent document DE 694 28 996 T2. As FIG. 1 shows, the TMBS is made up of an n$^+$ substrate 1, an n-epitaxial layer 2, at least two trenches 6 that are realized in n-epitaxial layer 2 by etching, metallic layers on the front side of chip 4 as an anode electrode and on the rear side of chip 5 as a cathode electrode, and oxide layers 7 between trenches 6 and metallic layer 4. Regarded electrically, the TMBS is a combination of an MOS structure (metallic layer 4, oxide layers 7, and n-epitaxial layer 2) and a Schottky diode (Schottky barrier between metallic layer 4 as anode and n-epitaxial layer 2 as cathode).

In the forward direction, currents flow through the mesa region between trenches 6. Trenches 6 themselves are not available for the flow of current. The effective surface for the flow of current in the forward direction is therefore smaller in a TMBS than in a conventional planar Schottky diode. The advantage of a TMBS lies in the reduction of the blocking currents. In the blocking direction, space charge zones form both in the MOS structure and in the Schottky diode. The space charge zones expand as the voltage increases, and, given a voltage that is less than the breakdown voltage of the TMBS, meet one another in the center of the region between adjacent trenches 6. In this way, the Schottky effects responsible for high blocking currents are shielded and the blocking currents are reduced. This shielding effect is strongly dependent on structural parameters Dt (depth of the trench), Wm (distance between the trenches), Wt (width of the trench), and To (thickness of the oxide layer); see FIG. 1.

A known procedure for producing the TMBS is as follows: realization of trenches 6 through etching of n-epitaxial layer 2; growth of oxide layer 7 and filling of the trenches with metal. The expansion of the space charge zones in the mesa region between trenches 6 is quasi-one-dimensional as long as the trench depth Dt is significantly greater than the distance between trenches Wm.

However, a decisive disadvantage of the TMBS lies in the weakness of the MOS structure. Upon breakdown, very high electrical fields arise within oxide layer 7 and directly in the vicinity of the oxide layer in n-epitaxial layer 2. The blocking currents flow mainly through the quasi-inversion layer of the MOS structure, along the trench surface. As a result, the MOS structure can be degraded through the injection of "hot" charge carriers from n-epitaxial layer 2 into oxide layer 7, and under certain operating conditions may even be destroyed. Because a certain amount of time is required for the formation of the inversion channel (deep depletion), the space charge zone can briefly expand further at the beginning of rapid switching processes, causing the electrical field strength to increase. This can result in a brief undesirable period of operation in breakdown. It is therefore not recommended to use TMBS as Zener diodes and to operate them in the breakdown region.

An alternative for improving the robustness of TMBS in breakdown operation is indicated by the TMBS-PN proposed in DE 10 2004 053 760. As FIG. 2 shows, the TMBS-PN is made up of an n$^+$ substrate 1, an n-epitaxial layer 2, at least two trenches 6 etched into n-epitaxial layer 2, metallic layers on the front side of chip 4 as an anode electrode and on the rear side of chip 5 as a cathode electrode, and oxide layers 7 between trenches 6 and metallic layer 4. The lower area of trenches 8 is filled with p-doped Si or poly-Si. Metallic layer 4 in particular can also be made up of two different metallic layers situated one over the other, or of a combination of polysilicon and metal. For clarity, this is not shown in FIG. 2.

Regarded electrically, the TMBS-PN is a combination of an MOS structure (metallic layer 4, oxide layers 7, and n-epitaxial layer 2), a Schottky diode (Schottky barrier between metallic layer 4 as anode and n-epitaxial layer 2 as cathode), and a PN diode (PN transition between p-tubs 8 as anode and n-epitaxial layer 2 as cathode). In the TMBS-PN, as in the conventional TMBS, currents in the forward direction flow only through the Schottky diode if the forward voltage of Schottky diode 4, 2 is significantly smaller than the forward voltage of the PN diode.

In the blocking direction, space charge zones form in the MOS structure, the Schottky diode, and the PN diode. The space charge zones expand as the voltage increases, and, given a voltage that is less than the breakdown voltage of the TMBS-PN, meet one another in the center of the region between adjacent trenches 6. In this way, the Schottky effects responsible for high blocking currents are shielded and the blocking currents are reduced. This shielding effect is strongly dependent on structural parameters Dox (depth of the trench portion having the oxide layer), Wm (distance between the trenches), Wt (width of the trench or of the p-tub), Dp. (depth of the trench portion having p-doped Si or poly-Si=thickness of the p-tub), and To (thickness of the oxide layer); see FIG. 2.

The TMBS-PN has a similar shielding effect on Schottky effects as does a TMBS, but in addition also offers high robustness due to the clamping function. The breakdown voltage of PN diode BV_pn is designed such that BV_pn is lower than the breakdown voltage of Schottky diode BV_schottky and the breakdown voltage of the MOS structure BV_mos, and the breakdown takes place on the floor of the trenches. During breakdown operation, blocking currents then flow only through the PN transitions, and not through the inversion layer of the MOS structure as in a TMBS. The TMBS-PN thus has robustness similar to a PN diode. Moreover, with the use of the TMBS-PN there is no need to fear the injection of "hot" charge carriers, because the high field strength during breakdown is not situated in the vicinity of the MOS structure. As a result, the TMBS-PN is well-suited for use in vehicle generator systems as a Zener power diode.

SUMMARY OF THE INVENTION

The core of the present invention is formed by Schottky diodes having high robustness and a small forward voltage, suitable for use as Zener power diodes in vehicle generator systems, as well as by a simple process management in the manufacture of such Schottky diodes.

The Schottky diodes according to the present invention are TMBS having an integrated substrate PN diode as a clamping element. In the following, for simplicity these are referred to as "TMBS-sub-PN."

In Schottky diodes according to the present invention, the p-tubs now extend up to the n$^+$ substrate. The breakdown voltage of the TMBS-sub-PN is determined by the pn transition between the p-tubs and the n$^+$ substrate. The design of the p-tubs is selected such that the breakdown voltage of substrate PN diode BV_pn is lower than the breakdown voltage of Schottky diode BV_schottky and the breakdown voltage of MOS structure BV_mos. During breakdown, the electrical field strength in the oxide layers is significantly lower than in the conventional TMBS. Moreover, the blocking currents flow mainly through the substrate PN diode and not through the inversion layer of the MOS structure.

The Schottky diodes according to the present invention have the advantage that, in comparison with the conventional TMBS, a high degree of robustness is achieved through the clamping function of the substrate PN diode. Therefore, they are advantageously well-suited for use in vehicle generator systems as Zener diodes, having a low field strength at the oxide. In comparison with TMBS and TMBS-PN, they have a smaller forward voltage due to the thinner epitaxial layer, and thus have a lower path resistance. In comparison with TMBS-PN, an advantageous, simpler process management takes place during the manufacture of the Schottky diodes according to the present invention.

BRIEF DESCRIPTION OF SEVERAL VIEWS OF THE DRAWINGS

FIG. 1 shows a trench MOS barrier Schottky diode (TMBS).

FIG. 2 shows a TMBS-PN having p-doped silicon or polysilicon in the lower region of the trenches.

DETAILED DESCRIPTION OF THE INVENTION

Figure 3:
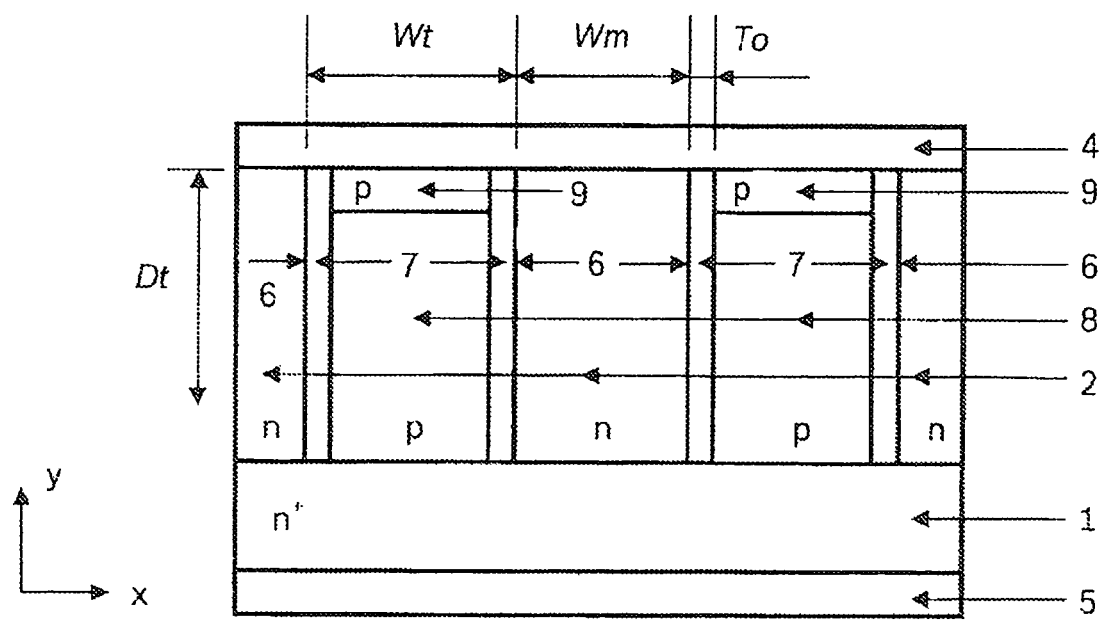
FIG. 3 shows an exemplary embodiment of a TMBS-sub-PN according to the present invention.

As FIG. 3 shows, the TMBS-sub-PN according to the present invention is made up of an n$^+$ substrate 1, an n-epitaxial layer 2, at least two trenches 6 etched through n-epitaxial layer 2 down to n$^+$ substrate 1, said trenches having a width Wt, a depth Dt, and a distance Wm between adjacent trenches 6, metallic layers on the, front side of chip 4 as anode electrode and on the rear side of chip 5 as cathode electrode, and oxide layers 7 having a thickness To on the side walls of trenches 6. The regions between oxide layers 7 in trenches 8 are filled with p-doped Si or poly-Si, and in their upper regions there are situated additional thin p$^+$ layers 9 for ohmic contact with metallic layer 4.

Regarded electrically, the TMBS-sub-PN is a combination of an MOS structure, i.e. a metallic layer 4 in combination with p-tub 8, oxide layer 7, and n-epitaxial layer 2, a Schottky diode having a Schottky barrier between metallic layer 4 as anode and n-epitaxial layer 2 as cathode, and a substrate-PN-diode whose PN transition is situated between p-tub 8 as anode and n$^+$ substrate 1 as cathode. P-tub 8 is designed such that the breakdown voltage of the TMBS-sub-PN is determined by the breakdown voltage of the PN transition between p-tub 8 and n$^+$ substrate 1. Moreover, a soft blocking characteristic curve is to be avoided by selecting the doping and geometry of p-tub 8 such that the space charge zone in the blocking case does not extend up to the surface of the trenches.

In the TMBS-sub-PN, as in a conventional TMBS or TMBS-PN, currents in the forward direction flow only through the Schottky diode if the forward voltage of the TMBS-PN is significantly smaller than the forward voltage of the substrate PN diode. In the blocking direction, space charge zones form in the MOS structure, the Schottky diode, and the substrate PN diode. As the voltage increases, the space charge zones expand both in epitaxial layer 2 and in p-tubs 8, and, given a voltage that is smaller than the breakdown voltage of the TMBS-sub-PN, meet in the center of the region between adjacent trenches 6. Due to this, the Schottky effects (barrier lowering) responsible for high blocking currents are shielded, and the blocking currents are reduced. This shielding effect is predominantly determined by the MOS structure, and is strongly dependent on structural parameters Dt (trench depth), Wm (distance between the trenches), Wt (trench width), and To (thickness of the oxide layer); see FIG. 3.

The TMBS-sub-PN has a similar shielding effect on Schottky effects as does a TMBS, but additionally offers a high degree of robustness due to the clamping function. The breakdown voltage of substrate PN diode BV_pn is designed such that BV_pn is lower than the breakdown voltage of Schottky diode BV_schottky and the breakdown voltage of MOS structure BV_mos, and the breakdown takes place at the substrate PN transition between p-tubs 8 and n$^+$ substrate 1. During breakdown operation, blocking currents then flow only through the substrate PN transition, and not through the inversion layer of the MOS structure as in a TMBS. The TMBS-sub-PN thus has robustness similar to a PN diode. Moreover, during breakdown of a TMBS-sub-PN the field strength in the oxide layers is smaller by more than a factor of three compared to a conventional TMBS, as device simulations for a 22V diode show. As a result, the TMBS-sub-PN is well-suited for use as a Zener diode in vehicle generator systems.

Figure 1:
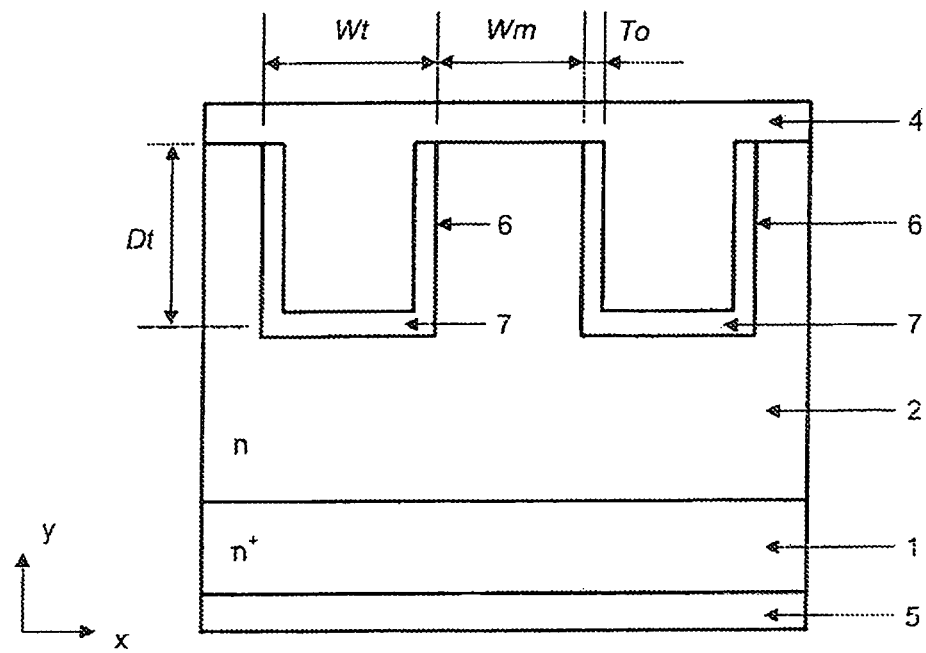
FIGS. 1 and 2 show embodiments already known from the prior art.
Figure 2:
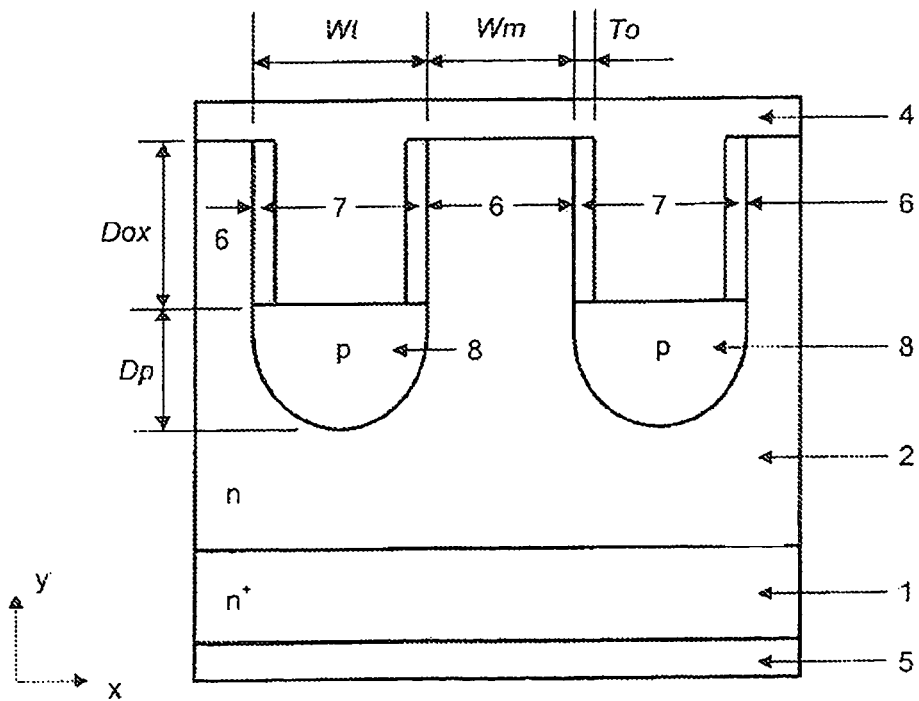

In comparison with the TMBS-PN, the TMBS-sub-PN according to the present invention has a smaller forward voltage, because the breakdown voltage of the TMBS-PN is not determined by the PN transition between p-tubs 8 and n-epitaxial layer 2 (FIG. 2), but rather is determined by the substrate PN transition between p-tubs 8 and n$^+$ substrate 1 (see FIG. 3). The portion of the n-doped epitaxial layer between p-zone 8 and n$^+$ substrate 1, present in the TMBS-PN, is omitted here. Therefore, the overall epitaxial thickness, and thus the path resistance, for achieving the same breakdown voltage is smaller in the TMBS-sub-PN. During operation in the forward direction, this is advantageously expressed as a lower forward voltage.

A further advantage of the TMBS-sub-PN in comparison with the TMBS-PN is the significantly simpler process management. The TMBS-sub-PN, or TMBS with integrated substrate PN diode as clamping element, can be manufactured using a standard trench process for power MOS, with slight modifications. A possible manufacturing method for TMBS-sub-PN could run as follows:

- $n^+$ substrate as initial material
- epitaxy
- trench etching down to the $n^+$ substrate
- oxidation of the surface of the trenches
- etching of the oxide layer on the floor of the trenches
- filling of the trenches with p-doped Si or poly-Si
- diffusion of a thin $p^+$ layer in the upper region of the trenches
- metallization on the front side and rear side.

The TMBS-sub-PN can have additional structures in the edge region of the chip for the reduction of the edge field strength. These can be for example low-doped p-regions, field plates, or similar structures known from the prior art.

What is claimed is:

1. A semiconductor system having a trench MOS barrier Schottky diode, comprising at least a combination of Schottky diode, MOS structure, and a PN diode as a clamping element, wherein the PN diode is configured as an integrated substrate PN diode, and the breakdown voltage of the substrate PN diode is lower than the breakdown voltage of the Schottky diode and the breakdown voltage of the MOS structure, wherein:

an n-epitaxial layer is situated on an $n^+$substrate and acts as a cathode zone of the Schottky diode, and a metal layer on the n-epitaxial layer acts as an anode of the Schottky diode, in a two-dimensional representation there are situated at least two trenches etched through the n-epitaxial layer down to the $n^+$substrate and oxide layers on side walls thereof, regions between the oxide layers in the trenches are filled with p-doped Si or poly-Si, and act as an anode zone of the substrate PN diode, and the n+ substrate acts as a cathode of the substrate PN diode, and thin $p^+$ layers are situated in upper regions of the trenches for ohmic contact with the metal layer.

2. The semiconductor system as recited in claim 1, wherein the system can be operated in breakdown with high currents.

3. The semiconductor system as recited in claim 2, wherein it is used as a Zener diode.

4. The semiconductor system as recited in claim 2, wherein a metallic layer is situated on the rear side of the chip and acts as a cathode electrode, and a metallic layer is situated on the front side of the chip and, having ohmic contact to p.sup.+ layers and having Schottky contact to the n-epitaxial layer, acts as an anode electrode.

5. The semiconductor system as recited in claim 1, wherein it is used as a Zener diode.

6. The semiconductor system as recited in claim 5, wherein a metallic layer is situated on the rear side of the chip and acts as a cathode electrode, and a metallic layer is situated on the front side of the chip and, having ohmic contact to p.sup.+ layers and having Schottky contact to the n-epitaxial layer, acts as an anode electrode.

7. The semiconductor system as recited in claim 1, wherein it is used as a Zener diode having a breakdown voltage of approximately 20V, for use in a vehicle generator system.

8. The semiconductor system as recited in claim 1, wherein a metallic layer is situated on the rear side of the chip and acts as a cathode electrode, and a metallic layer is situated on the front side of the chip and, having ohmic contact to p.sup.+ layers and having Schottky contact to the n-epitaxial layer, acts as an anode electrode.

9. The semiconductor system as recited in claim 1, wherein a metallic layer is situated on the rear side of the chip and acts as a cathode electrode, and a metallic layer is situated on the front side of the chip and, having ohmic contact to p.sup.+ layers and having Schottky contact to the n-epitaxial layer, acts as an anode electrode.

10. The semiconductor system as recited in claim 1, wherein the trenches are etched through the n-epitaxial layer down to the n.sup.+ substrate, and have a rectangular shape, a U-shape, or some other predeterminable selectable shape.

11. The semiconductor system as recited in claim 1, wherein the trenches are etched through the n-epitaxial layer down to the n.sup.+ substrate, and have a rectangular shape, a U-shape, or some other predeterminable selectable shape.

12. The semiconductor system as recited in claim 1, wherein the p-tubs are configured such that no punch-through effect and the breakdown of the substrate PN diode takes place at the transition between the p-tubs and the n.sup.+ substrate.

13. The semiconductor system as recited in claim 1, wherein the metallization is made up of two or more metallic layers situated one over the other.

14. The semiconductor system as recited in claim 1, wherein the trenches are situated in a strip configuration or as islands.

15. The semiconductor system as recited in claim 14, wherein the islands are circular, hexagonal, or are fashioned with a predeterminable shape.

* * * * *

UNITED STATES PATENT AND TRADEMARK OFFICE
CERTIFICATE OF CORRECTION

PATENT NO. : 8,497,563 B2  Page 1 of 1
APPLICATION NO. : 12/733753
DATED : July 30, 2013
INVENTOR(S) : Qu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this

Fifteenth Day of September, 2015

Michelle K. Lee
*Director of the United States Patent and Trademark Office*